United States Patent [19]

Nagano et al.

[11] 4,450,467

[45] May 22, 1984

[54] GATE TURN-OFF THYRISTOR WITH SELECTIVE ANODE PENETRATING SHORTS

[75] Inventors: Takahiro Nagano, Hitachi; Isamu Sanpei, Kitaibaraki; Shuroku Sakurada; Masaru Nakagawa, both of Hitachi, all of Japan

[73] Assignee: Hitachi, Ltd., Tokyo, Japan

[21] Appl. No.: 273,035

[22] Filed: Jun. 12, 1981

Related U.S. Application Data

[63] Continuation of Ser. No. 74,523, Sep. 11, 1979, abandoned.

[30] Foreign Application Priority Data

Sep. 14, 1978 [JP] Japan ............................. 53-112257

[51] Int. Cl.³ .................................................. H01L 29/74
[52] U.S. Cl. ................................... 357/38; 357/20; 357/86; 357/89
[58] Field of Search ................. 357/20, 38, 39, 86, 357/89

[56] References Cited

U.S. PATENT DOCUMENTS

| | | | |
|---|---|---|---|
| 3,239,728 | 3/1966 | Aldrich et al. | 357/38 |
| 3,914,782 | 10/1975 | Nakata | 357/38 |
| 4,007,475 | 2/1977 | Collumeau | 357/39 |
| 4,356,503 | 10/1982 | Shafer et al. | 357/38 |

FOREIGN PATENT DOCUMENTS

| | | | |
|---|---|---|---|
| 2906721 | 9/1979 | Fed. Rep. of Germany | 357/38 |
| 2341204 | 9/1977 | France | 357/38 |
| 52-2287 | 1/1977 | Japan | 357/38 |
| 52-69281 | 6/1977 | Japan | 357/38 |
| 53-16584 | 2/1978 | Japan | 357/38 |

OTHER PUBLICATIONS

H. Oka et al., "Electr. Char. of H-V, H-PWR Fast-SW, Rev-Cond. Thyristor and Appl. for Chopper Use," IEEE Trans. on Ind. Appl., vol. IA-9, #2, Mar.-Apr., 1973, pp. 236-247.

*Primary Examiner*—Joseph E. Clawson, Jr.
*Attorney, Agent, or Firm*—Antonelli, Terry & Wands

[57] ABSTRACT

A gate turn-off thyristor of a short-circuited emitter configuration comprises a semiconductor substrate of a $P_E$-$N_B$-$P_B$-$N_E$ four-layer structure, wherein a $P_E$-layer is short-circuited through a $N_B$-layer and an anode. The $N_B$-layer includes heavily doped regions to which the anode is ohmic contacted with a low resistance. The $P_E$-layer is provided at a location at least covered by a projection of the $N_E$-layer. The thickness of the heavily doped regions is greater than that of the $P_E$-layer. The improved structure assures satisfactory gate turn-off characteristics, although the semiconductor substrate is not doped with a life time killer impurity.

12 Claims, 8 Drawing Figures

GATE TURN-OFF THYRISTOR WITH SELECTIVE ANODE PENETRATING SHORTS

This is a continuation of application Ser. No. 074,523, filed Sept. 11, 1979, now abandoned.

The present invention relates in general to a thyristor and in particular to a gate turn-off thyristor (hereinafter referred to as GTO) which can be turned on and off under the control of a signal applied to a gate electrode.

In general, a transistor and a GTO are known as typical semiconductor switching devices which are capable of turning on and off a load current in response to a control signal. These semiconductor switching devices exhibit advantages in one respect and suffer from disadvantages in another respect. For controlling a large power such as a load current greater than 30A at a voltage higher than 600 V, a GTO which is capable of withstanding an over-load current is apparently desirable.

The GTO is generally implemented in a four-layer semiconductor structure with the semiconductor layers located adjacent to each other being of opposite conductivity types and comprise a pair of main electrodes ohmic contacted with a low resistance to the outermost semiconductor layers, respectively, and a control or gate electrode ohmic contacted with a low resistance to one of the inner semiconductor layers located adjacent to one of the outer semiconductor layers. Usually, a plurality of such GTO units are realized in a single semiconductor substrate wafer in a composite manner. Usually, in most of the commercially available GTO devices, the semiconductor substrate is doped with a life time killer such as gold in an attempt to increase the turn-off gain $B_{OFF}$ which represents the ratio of control or gate current to load current and to shorten the turn-off time $t_q$.

However, the semiconductor substrate doped with the life time killer impurity involves various shortcomings. For example, the on-state voltage $V_T$ appearing across GTO in the conducting state thereof tends to become high. A large leakage current in the blocking state of GTO will be produced. Further, as a junction temperature becomes high, activity of the life time killer becomes dull, to thereby deteriorate the turn-off performance of GTO.

Besides, it is extremely difficult to dope a semiconductor substrate uniformly with gold serving as the life time killer, because gold is very susceptible to the influences of the defects of the semiconductor substrate as well as distribution of dopant concentration. For these reasons, a GTO is manufactured only with a low yield, while difficulty is encountered in implementing a high power GTO.

Accordingly, an object of the invention is to provide a GTO which exhibits an improved turn-off performance without need for the doping of a life time killer.

Another object of the invention is to provide an improved structure of a GTO which allows the on-state voltage $V_T$ and the leakage current to be limited to a minimum level while being capable of maintaining an adequate forward blocking capability as well as an improved gate turn-off performance.

Still another object of the invention is to provide a GTO which can be manufactured with a high yield and is suited for meeting a high power requirement.

According to a general aspect of the invention, there is proposed a gate turn-off thyristor or GTO device including a plurality of GTO units implemented in a single semiconductor substrate in a composite manner. Each of the GTO units comprises a pair of intermediate or inner base layers and a pair of emitter layers disposed so as to sandwich the paired inner base layers, wherein the semiconductor layers located adjacent to each other are of the conductivity types opposite to each other. One of the base layers includes regions of a high impurity concentration (referred to also as the heavily doped regions) and a region of a low impurity concentration (referred to also as the lightly doped region). One of the emitter layers and the heavily doped region are exposed to one of major surfaces of the semiconductor substrate in which at least a portion of the one emitter layer or the whole thereof is present at a location corresponding to a projection of the other emitter layer. The heavily doped regions have a thickness greater than that of the one emitter layer and located adjacent to the lightly doped region. An anode electrode is ohmically contacted with a low resistance to one emitter layer and the heavily doped region at one major surface, and a cathode electrode is ohmically contacted to the other emitter layer and a gate electrode is contacted to the other base layer with a low resistance.

Above and other objects, novel features and advantages of the present invention will become more apparent by examining the following description of preferred embodiments taken in conjunction with the accompanying drawings, in which.

Figure 1:
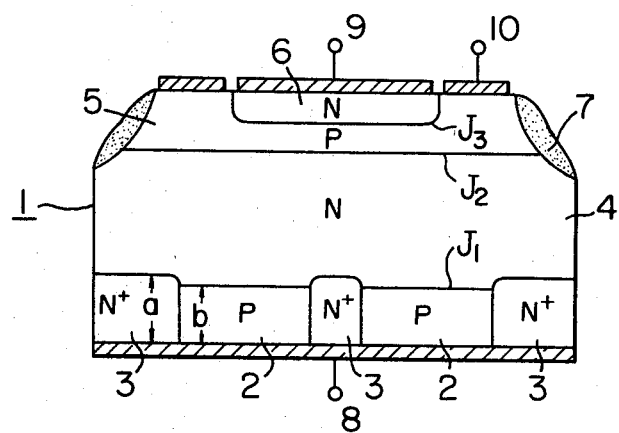
FIG. 1 is a longitudinal sectional view of a GTO according to an embodiment of the invention.
Figure 2:
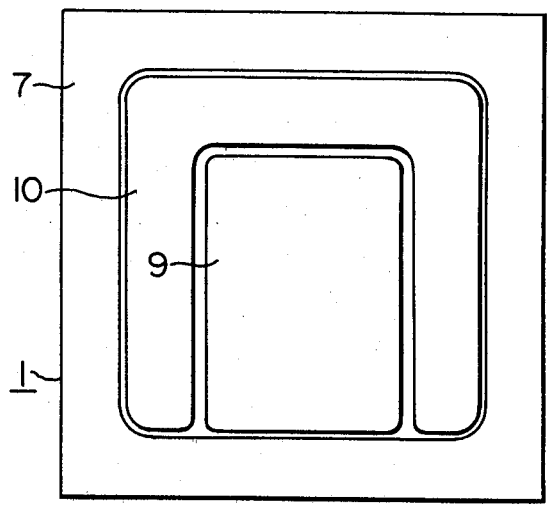
FIG. 2 is a top plan view of the GTO shown in FIG. 1 as viewed from the side of the cathode electrode.
Figure 3:
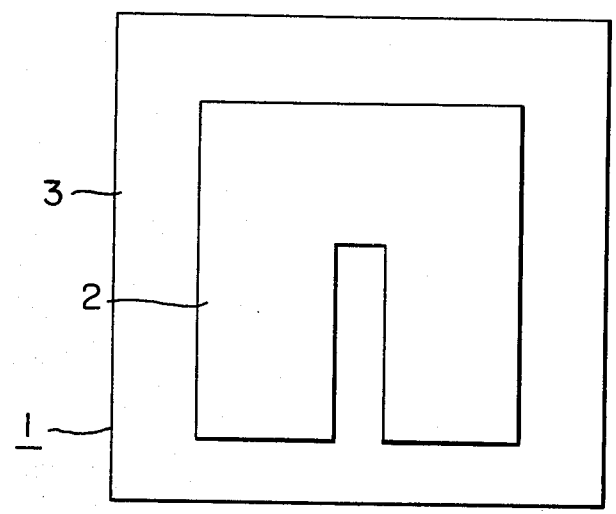
FIG. 3 is a top plan view of the same as viewed from the anode side.

Referring to FIGS. 1 to 3, reference numeral 1 denotes a semiconductor substrate, 2 denotes a P type emitter layer, and numeral 3 designates regions of a high impurity concentration constituting one part of an N type base layer. It should be noted that the high impurity concentration regions or heavily doped regions of the N type base layer are not provided to surround the whole P type emitter layer 2 but formed selectively and discretely only in a direction perpendicular to the major surfaces of the substrate of the semiconductor substrate 1, as shown in FIG. 1. Reference numeral 4 designates a region of a low impurity concentration region (i.e. lightly doped region) constituting the other part of the N type base layer, 5 denotes a P type base layer, 6 denotes an N type emitter layer, 7 denotes a junction surface stabilizing film, i.e. passivation film, 8 denotes an anode electrode, 9 denotes a cathode electrode, and 10 denotes a gate electrode. The P type emitter layer 2 and the N type emitter layer 6 have respective portions which can be defined by a closed curve in common and superposed onto each other when projected in the aforementioned perpendicular direction. The anode electrode 8 is ohmically contacted with a low resistance to the N type base layer through the N type heavily doped regions 3 and also to the P type emitter layer 2. It is to be noted that the N type heavily doped regions 3 have a greater thickness than that of the P type emitter layer 2. The cathode electrode 9 is ohmically contacted with a low resistance only to the exposed surface of the N type emitter region 6. The gate electrode 10 is disposed so as to surround the cathode electrode 9 an ohmic contacted with a low resistance only to the exposed surface of the P type base layer 5. It should be mentioned that a life time killer impurity such as gold is not doped in the semiconductor substrate at all.

Studies by the inventors of the present invention have shown that a short-circuited P type emitter configuration of the gate turn off thyristor or GTO brings about not only a decreased current amplification factor of a PNP transistor portion which is constituted by the P type emitter layer 2, N type base layer 4 and P type base layer 5 but also is effective to remove the carriers stored in the N type base layer 4 adjacent to the P type emitter layer 2. A carrier density in the vicinity of a center junctions ($J_2$) formed by the N type base layer 4 and the P type base layer 5 exerts remarkable influences to the turn-off characteristics of GTO, as described below.

In a steady "ON" or conducting state of GTO, a P-emitter junction $J_1$ formed by the P type emitter layer 2 and the N type base layer 4, the center junction $J_2$ and an N-emitter junction $J_3$ formed by the P type base layer 5 and the N type emitter layer 6 are all biased forwardly. For turning off a GTO starting from this state, a reverse bias is applied across the gate electrode 10 and the cathode electrode 9. In consequence, carriers are removed or extracted from the P type base layer 5, resulting in a correspondingly reduced carrier density in the vicinity of the junction $J_2$ which will eventually lead to the removal of the forward bias from the junction $J_2$. When a depletion layer has been formed in the vicinity of the center junction $J_2$, impedance of the adjacent zones is increased. When the impedance has been increased to a degree substantially equal to a load impedance, a load current will then begin to be decreased. The time interval which extends up to this time point from the instant of applying the turn-off signal is a so-called storage period. At this time point, the cathode current however flows in the same direction as in the steady "ON" state, whereby the junction $J_3$ is still maintained in the forwardly biased state. Accordingly, the gate current is limited to a value determined by the gate voltage and the gate resistance. When the anode current begins to be decreased, the carrier supply from the junction $J_1$ to the junction $J_2$ will also be decreased. On the other hand, the carriers are still being extracted through the gate electrode 10. The former effect in combination with the latter causes the rate at which the carriers are decreased in the vicinity of the junction $J_2$ to be rapidly increased, resulting in a rapid decreasing of the anode current. The time duration up to this time point from the end of the stroage period is a so-called fall period. When the anode current has been decreased to a level lower than the limited gate current described above, the direction of the cathode current which represents a difference between the anode current and the gate current is inverted to involve a mode for recovering the junction $J_3$. Upon completion of recovery of the junction $J_3$, the GTO operates just in the same manner as a PNP transistor which is in an active operation mode as driven by the residual charge remaining in the N type base layer 4. Under this circumstance, the anode current will continue to flow until the residual charge has been neutralized through re-combination of the charge carriers. This duration is referred to as the tail period for convenience sake. When the P emitter layer 2 is in the short-circuited emitter configuration, the anode current is divided into a current flowing through the P type emitter layer 2 and a shunt current flowing through the short-circuited path in the steady "ON" state of GTO. Since the former current is substantially ascribable to holes, while the latter current is made by electrons, the quantity of holes stored in the vicinity of the junction $J_2$ can be reduced significantly as compared with the circuit configuration in which the P type emitter layer 2 is free of the short circuit. Consequently, the time required for the junction $J_2$ to get rid of the saturated state upon gate turn-off operation of GTO is shortened. In other words, the storage period recited hereinbefore is shortened. Further, the fall period is also shortened, since the supply of positive holes from the P type emitter layer 2 is decreased during this period. During the tail period, the residual carriers remaining in the N type base layer 4 are neutralized not only through recombination but also through extraction to the exterior by way of the short-circuit. In this manner, even when the life time of the charge carriers is left relatively long without resorting to the doping of the life time killer such as gold, the tail period can be shortened. It will thus be appreciated from the foregoing description that the GTO implemented in the configuration in which the P type emitter layer 2 is short-circuited in an optimum design pattern can enjoy an improved turn-off performance without the necessity of doping the semiconductor substrate with a life time killer impurity such as gold.

The inventors have investigated the distribution of impurity concentration in the heavily doped regions 3 for attaining the low resistance contact between the N base layer 4 and the anode electrode 8 as well as the relationship between the performance characteristics of GTO and the mutual geometrical relation of the N type emitter layer 6 and the P type emitter layer 2.

It has been found that some specific relationships have to be accomplished among the factors described above in order to lower the voltage in the "ON" or conducting state of a GTO and reduce the leakage current in the forward blocking or "OFF" state.

It should first be pointed out that the relative disposition of the N type emitter layer 6 and the P type emitter layer 2 in the manner described hereinbefore (i.e. these layers have respective portions defined by a closed curve in common and superposed onto each other when projected in a direction perpendicular to the major surfaces of the substrate as well as selection of thickness a and b of the N type heavily doped regions 3 and the P type emitter layer 2 such that a>b as illustrated in FIG. 1 bring about the effects described belows.

In the steady "OFF" or non-conducting state, the charge carriers produced in the depletion layer (not shown) expanded into the N type base layer 4 are corrected at the projecting portions of the N type heavily doped regions 3. In consequence, the injection of holes from the P type emitter layer 2 is suppressed, whereby the leakage current can be reduced. In general, GTO exhibits a voltage withstanding capability which depends on the temperature of the semiconductor substrate and is rapidly lowered when the temperature has increased beyond about 110° C. In contrast, in the case of a GTO according to the invention, the voltage withstanding capability thereof can be maintained adequately up to the temperature of about 150° C. due to the fact that the leakage current can be suppressed to a minimum because of absence of the life time killer dopant. More specifically, when the N type heavily doped regions 3 are present in the lateral peripheral portions of the semiconductor substrate 1 as shown in FIGS. 1 and 2, the peripheral portion constitutes a diode of a P-N-N+ structure. Thus, the current amplification factor $h_{FE}$ inherent to the transistor structure can be neglected. Consequently, the leakage current is held to a minimum without undergoing any amplifying action.

Next, consideration is made of the steady "ON" or conducting state. By virtue of such arrangement the N type emitter layer 6 and the P type emitter layer 2 are superposed at least partially onto each other when projected in a perpendicular direction as described hereinbefore, the distance between the N type emitter layer 6 and the P type emitter layer 2 can be realized shortest as determined by the thickness of the N type base layer 4. Consequently, the conductivity of all the primary current flow paths is modulated by the holes injected into the N type base layer 4 from the P type emitter layer 2 sufficiently to maintain the on-state voltage (i.e. voltage in the conducting state of GTO) at a low level.

Further, because the semiconductor substrate is not doped with any life time killer, the on-state voltage $V_T$ will not be increased due to the presence of the life time killer dopant.

Upon the gate turn-off operation of the GTO, the number of the residual carriers is rapidly decreased in particular during the tail period because the residual carriers in the N type base layer 4 are subjected to recombination at the protrusions of the N type heavily doped regions 3. In other words, the tail period is short. The effect due to the carrier recombination at the protrusions of the N type heavily doped regions 3 becomes most significant when the density of carrier in the vicinity of the junction $J_1$ injected from the P type emitter layer 2 is lowered. Accordingly, disadvantages which would otherwise be involved owing to the above effect for a high density of the injected carriers (e.g. undesirable high on-state voltage or the like) can be completely avoided. The residual carriers undergo not only the recombination at the protrusions or projections of the heavily doped region 3 but also are removed to the anode 8 through the heavily doped regions 3. Because the junctions between the regions 3 and the base layer 4 are the junctions formed between the semiconductor layers of the same conductivity type, the potential barrier is made to be a relatively low level. The same will apply to the junctions between the heavily doped regions 3 and the anode 8 because of the high impurity concentration in these regions 3. Thus, the residual carriers can be easily removed toward the anode 8 over the barriers, the tail period is made short nevertheless of the fact that the life time killer is not present.

The turn-off time $t_q$ is in general increased in proportion to a junction temperature $T_j$. In the case of the structure of GTO according to the invention, the ratio of increase in the turn-off time $t_q$ can be significantly reduced as compared with the prior art structures of GTOs for the reasons described below, although the turn-off time $t_q$ is lengthened to some degree as a function of the junction temperature $T_j$.

In the case of the emitter short-circuited configuration of a GTO, the attenuation factor of electric charge in the N type base layer 4 upon the turn-off operation is given by the following expression:

$$\frac{Q_{B1}}{\tau_{B1}} + \frac{V_{10} - V_1}{R_{so}} \cdot \frac{Q_o + Q_{B1}}{Q_o}$$

where
$Q_{B1}$: charge density in the N type base layer 4,
$\tau_{B1}$: life time of carrier in the N type base layer 4,
$V_{10}$: potential barrier in the thermal equilibrium state at the P type emitter junction,
$V_1$: bias voltage at the P type emitter junction (it is assumed that the forward bias is represented by positive sign),
$R_{so}$: short-circuit resistance in the thermal equilibrium state, and
$Q_o$: charge density in the N type base layer 4 in the thermal equilibrium state.

Now, consideration will be made on the temperature dependency of the above factors. When the junction temperature becomes high in a range of normal operating temperature, the life time $\tau_{B1}$ becomes longer while the potential barrier $V_{10}$ and the short-circuit resistance $R_{so}$ becomes low. The parameters $V_1$ and $Q_o$ remain substantially invariable. Accordingly, the value resulted from the first term of the above expression becomes small, while that of the second term remains substantially unvariable. Thus, the charge attenuation factor becomes small, which means that the turn-off time $t_q$ is lengthened. However, in the case of the short-circuited P type emitter configuration of GTO, the absolute value derived from the first term of the above expression is set for smaller than the one defined by the second term. Thus, variation in the turn-off time $t_q$ can be confined to an extremely small value.

According to the first embodiment of the invention described in the foregoing, a gate turn-off thyristor or GTO has been fabricated in the manner described below.

A first, a single crystal silicon wafer having a resistivity of 50 Ω.cm and a thickness of 240 μm is prepared. The silicon wafer is then subjected to a heat treatment in an oxygen atmosphere containing steam at 1100° C. for two hours, to thereby form an oxide film of about 1 μm on the major surfaces of the wafer. Subsequently, phosphorus is selectively diffused from one major surface of the silicon wafer to a diffusion depth of about 45 μm through a known photo-etching process (formation of the N type heavily doped region 3). Next, the single crystal silicon wafer is placed in a vacuum together with gallium and subjected to heat treatment at 1150° C. for four hours. Since gallium is immune to the masking action of the oxide film, gallium is diffused into the single crystal silicon wafer over the whole surface thereof. However, since the regions which have been diffused with phosphorus at the preceding step are prevented from being converted to the P conductivity type, because the concentration of phosphorus is higher than that of gallium. In other words, selective diffusion of gallium can be accomplished through the preceding diffusion of phosphorus. The wafer which is now diffused selectively with gallium is then subjected to a heat treatment at 1250° C. for about ten hours (for forming the P type emitter layer 2 and the P type base layer 5) and thereafter diffused selectively again with phosphorus to a diffusion depth of about 15 μm from the other major surface through a known photoetching process (formation of the N type emitter region 6). Subsequently, the center junction (J₂) is exposed to the surface through mesa etching and stabilized by coating a glass film (deposition of the passivation film 7). After evaporation of a metal under vacuum, a metallization pattern corresponding to the anode 8, the cathode 9 and the gate electrode 10 is formed through a well known photoetching process. Finally, the semiconductor wafer is mounted on a stem by soldering and is sealed to finish a GTO in a can.

The manufacturing method described above is advantageous in that an enhanced yield can be attained through a simplified process because both the P type emitter layer 2 and the P type base layer 5 are simultaneously formed through a single thermal diffusion step. The thickness of the P type emitter layer 2 as measured from the adjacent major surface is substantially equal to that of the P type base layer 5 as measured from the other major surface.

In the manufacturing process described above, it should be mentioned that aluminium may be employed in place of gallium. The use of aluminium and gallium as the dopant brings about an advantage that the time required for the heat diffusion treatment is relatively short because they have larger diffusion coefficients than that of boron in a single crystal silicon substrate.

Figure 4:
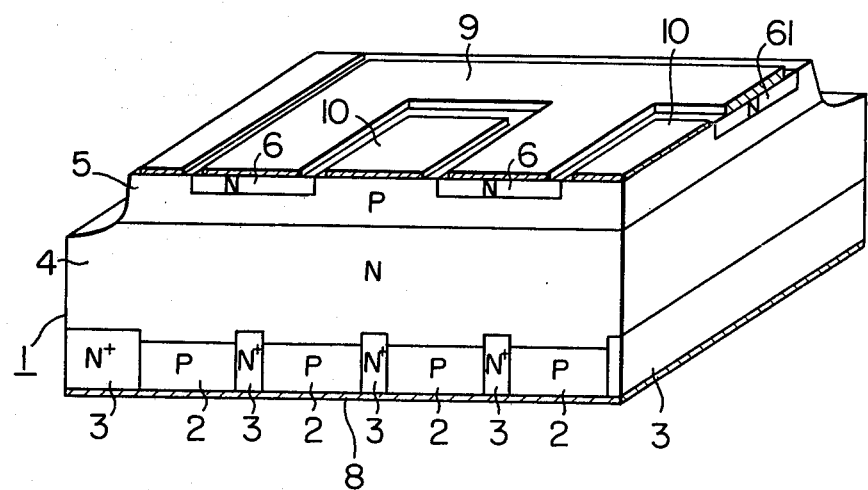
FIG. 4 is a perspective view showing a GTO according to another embodiment of the invention with a portion being broken away.

FIG. 4 shows a second preferred embodiment of the invention. In this figure, the same reference numerals as those used in the description of the first embodiment denote the same or equivalent parts.

In the second embodiment of GTO, a plurality of the N type emitter layers 6 are provided with a view to increasing the current capacity of GTO. Cathode electrodes 9 are ohmic contacted with a low resistance to the individual emitter layers 6 and to the exposed surface of an N type region 61 connected to the emitter layers 6. Since a cathode lead wire (not shown) may be bonded only to the cathode terminal contacted to the N type region 61, the fabrication of the device is facilitated. In this connection, it is however to be noted that the P type emitter layer 2 should not be formed in the major surface in which the N type region 61 is formed, because otherwise a PNPN junction would be formed in the single crystal silicon wafer in the direction corresponding to the thickness thereof, which might involve a danger of the PNPN junction being turned on under the influence of operation of the thyristor. When such turn-on has once occurred, it becomes difficult to turn-off again the PNPN junction because of the absence of the N type heavily doped regions 3 an the vicinity of the PNPN junction.

In the case of the exemplary embodiment illustrated in FIG. 4, it is desirable that the distance between the P type emitter layer 2 and the N type region 61 should be selected longer than the diffusion length of positive holes in the N type base region 4.

Figure 5:
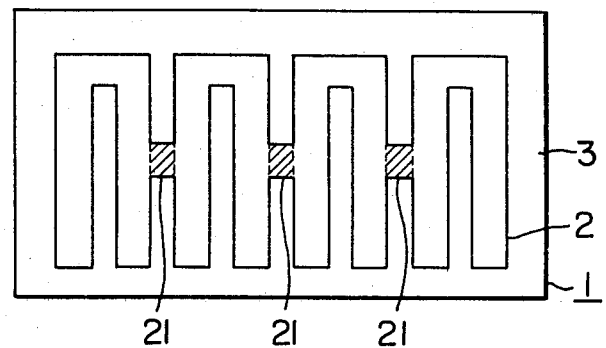
FIG. 5 is a top plan view of a GTO according to a further embodiment of the invention, as viewed from the anode side.

When a plurality of the P type emitter layers 2 are to be formed in the regions located adjacent to the anode 8 in correspondence to the longitudinal projections of the plural N type emitter regions 6 as is in the case of the embodiment shown in FIG. 4, the individual P type emitter layers should preferably be interconnected through P type regions 21 in such pattern as illustrated in FIG. 5. When such interconnections are provided, then the current flowing through a GTO unit which is turned on from the blocking state will propagate to other non-fired GTO units through the interconnections 21, whereby the whole device is instantaneously turned on. This means that the di/dt withstanding capability can be increased because the whole semiconductor substrate is caused to turn-on by a small gate current in a short time. The interconnections 21 are indicated by hatched areas in FIG. 5. In order to assure the satisfactory turn-off performance, the interconnections 21 are not provided in the portions which corresond to the longitudinal projections of the N type region 61 interconnecting the N type emitter layers 6 of the individual GTO units.

Although no specific description has been made on the surface configuration of the cathode electrode, in the foregoing, it will be appreciated that various known surface patterns may be applied.

Figure 6:
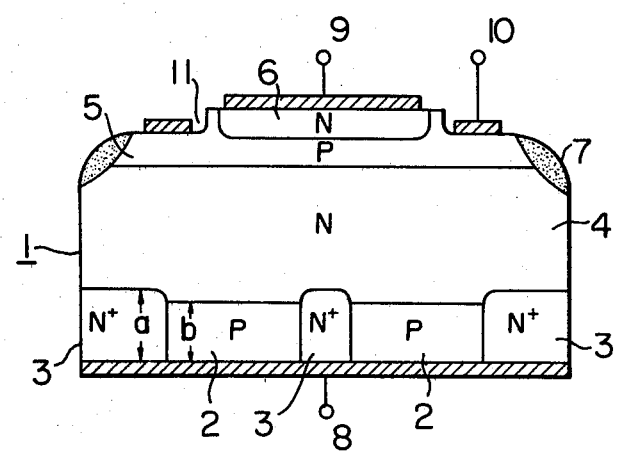
FIGS. 6 to 8 are longitudinal sectional views showing, respectively, variations of the GTO according to the invention.

FIG. 6 shows another embodiment of the invention in which the PN junction formed by the P type base layer 5 and the N type emitter layer 6 is implemented in a planar structure, wherein the P type base layer 5 is etched down to form a groove-like portion 11 on which the gate electrode 10 is deposited.

Figure 7:
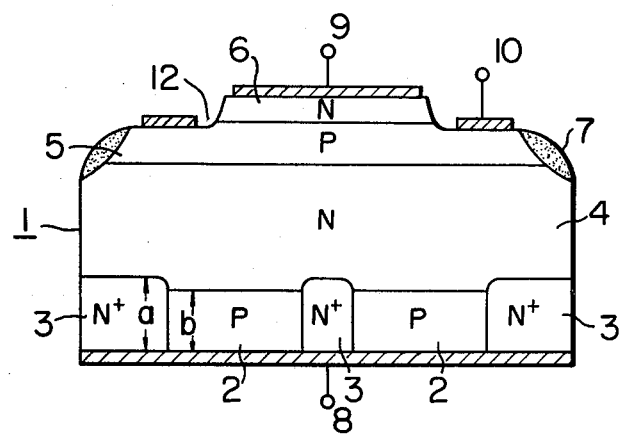
Figure 8:
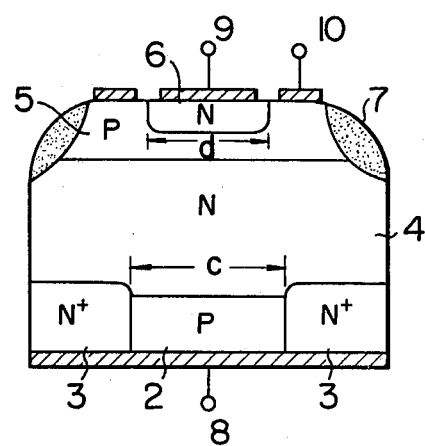

FIG. 7 shows another embodiment in which the junction J₃ is implemented in a planar structure, wherein the gate electrode 10 is provided on a groove 12 formed by etching down the P type base layer 5. Of course, the structures shown in FIGS. 6 and 7 can be applied to the GTO structures shown in FIGS. 4 and 5. The N type heavily doped region 3 formed immediately below the N type emitter layer 6 may be omitted without the adverse influence to the desired turn-off characteristic, when the widths c and d of the P type emitter layer 2 and the N type emitter layer 6 are relatively small.

It should be mentioned here that the exposed portions of the PN junctions J₁ and J₃ are also provided with respective surface stabilizing films or passivation films such as silicon oxide films or silicon rubber or the like, although they are not illustrated in the figures.

The foregoing description has been made on the four-layer PNPN structure as viewed from the emitter layer 2 toward the emitter layer 6. However, it will be appreciated that quite same effects can be obtained in the case of the reversed four-layer structure, i.e. NPNP structure.

What is claimed is:
1. A gate turn-off thyristor, comprising:
a semiconductor substrate having first and second major surfaces;
said semiconductor substrate having four semiconductor layers including:
an anode layer of a first conductivity type and a predetermined thickness, said anode layer having a first layer surface lying in said first major surface and having a second layer surface;
a lightly doped anode-base layer of a second conductivity type having a first layer surface contiguous with the second layer surface of said anode layer and having a second layer surface;
a cathode-base layer of a first conductivity type having a first layer surface contiguous with the second layer surface of said anode-base layer and having a second layer surface; and
a cathode layer of said second conductivity type having a first layer surface contiguous with the second layer surface of said cathode-base layer and having a second layer surface lying in said second major surface,
wherein said anode-base layer further comprises selected portions of highly doped semiconductor material of said second conductivity type extend- ing deeper than said thickness of said anode layer from said first major surface through said anode layer into said lightly doped anode-base layer;

at least one of said highly doped selected portions of said anode-base layer serving as a shorting region for said gate turn-off thyristor to short across said anode layer to couple said lightly doped anode-base layer to said first major surface;

a part of said anode layer and the cathode layer being superposed with respect to each other when the part of said anode layer is projected onto the cathode layer in a direction perpendicular to said major surfaces of the substrate;

an anode electrode provided at said first major surface in contact with said anode layer and said highly doped selected portions of said anode-base layer;

a cathode electrode connected only to said cathode layer; and a gate electrode provided at the cathode-base layer for controlling the on and off operation of the thyristor by controlling a current flow between said cathode and anode electrodes in accordance with a gate signal applied to said gate electrode.

2. A gate turn-off thyristor, comprising:

a semiconductor substrate having first and second major surfaces;

said semiconductor substrate having four semiconductor layers including:

an anode layer of a first conductivity type and a predetermined thickness, said anode layer having a first layer surface lying in said first major surface and having a second layer surface;

a lightly doped anode-base layer of a second conductivity type having a first layer surface contiguous with the second layer surface of said anode layer and having a second layer surface;

a cathode-base layer of a first conductivity type having a first layer surface contiguous with the second layer surface of said anode-base layer and having a second layer surface; and a cathode layer of said second conductivity type having a first layer surface contiguous with the second layer surface of said cathode-base layer and having a second layer surface lying in said second major surface, wherein said anode-base layer further comprises selected portions of highly doped semiconductor material of said second conductivity type extending deeper than said thickness of said anode layer from said first major surface through said anode layer into said lightly doped anode-base layer;

a part of said anode layer and the cathode layer being superposed with respect to each other when the part of said anode layer is projected onto the cathode layer in a direction perpendicular to said major surfaces of the substrate;

at least one of said highly doped selected portions of said anode-base layer being superimposed with respect to a central region of said cathode layer when said one of said highly doped selected portions is projected onto said cathode layer in said direction perpendicular to said major surfaces of the substrate so that said at least one highly doped selected portion serves as a shorting region for said gate turn-off thyristor aligned with said central region of said cathode layer to short across said anode layer to couple said lightly doped anode-base layer to said first major surface;

an anode electrode provided at said first major surface in contact with said anode layer and said highly doped selected portions of said anode-base layer;

a cathode electrode connected only to said cathode layer; and a gate electrode provided at the cathode-base layer for controlling the on and off operation of the thyristor by controlling a current flow between said cathode and anode electrodes in accordance with a gate signal applied to said gate electrode.

3. A gate turn-off thyristor accoding to claim 1 or 2, wherein each of said cathode and anode layers includes a plurality of semiconductur regions.

4. A gate turn-off thyristor according to claim 1 or 2, wherein said highly doped selected portions of said anode-base layer are exposed at sidewall portions of said semiconductor substrate.

5. A gate turn-off thyristor according to claim 1 or 2, wherein said anode layer and said cathode-base layer are of P type conductivity, while said cathode layer and said anode-base layer are of N type conductivity.

6. A gate turn-off thristor according to claim 1 or 2, wherein said anode layer and said cathode-base layer are of N type conductivity, while said cathode layer and said anode-base layer are of P conductivity type.

7. A gate turn-off thyristor according to claim 3, further comprising interconnection semiconductor regions of the same conductivity type as that of said anode layer interconnecting said plurality of semiconductor regions of the anode layer at locations except for those corresponding to projections of said plurality of the semiconductor regions of said cathode layer onto said first major surface.

8. A gate turn-off thyristor according to claim 3, further comprising an interconnection semiconductor region of the same conductivity type as that of said cathode layer interconnecting said plurality of semiconductor regions of the cathode layer at locations except for those corresponding to projections of said plurality of the semiconductor regions of said anode layer onto said second major surface.

9. A gate turn-off thyristor according to claim 7, wherein said electrode is additionally contacted to the interconnecting semiconductor regions interconnecting said plurality of the semiconductor regions of said anode layer.

10. A gate turn-off thyristor according to claim 8, wherein said cathode electrode is additionally contacted to the interconnection semiconductor region interconnecting said plurality of the semiconductor regions of said cathode layer.

11. A gate turn-off thyristor according to claim 2, wherein said highly doped selected portions of said anode-base layer are geometrically discrete.

12. A gate turn-off thyristor according to one of claims 1 or 2, wherein a thyristor portion and a transistor portion are constituted from said semiconductor layers, said portions comprising a parallel circuit means for conducting in the forward conduction direction upon imposition of a positive polarity voltage at said anode electrode.

* * * * *